(12) United States Patent
Haddad et al.

(10) Patent No.: US 10,250,379 B2
(45) Date of Patent: Apr. 2, 2019

(54) CLOCK RECOVERY DEVICE WITH SWITCHABLE TRANSIENT NON-LINEAR PHASE ADJUSTER

(71) Applicant: Microsemi Semiconductor ULC, Kanata (CA)

(72) Inventors: Tariq Haddad, Ottawa (CA); Kamran Rahbar, Kanata (CA); Peter Meyer, Ottawa (CA)

(73) Assignee: MICROSEMI SEMICONDUCTOR ULC, Kanata (CA)

( * ) Notice: Subject to any disclaimer, the term of this patent is extended or adjusted under 35 U.S.C. 154(b) by 0 days.

(21) Appl. No.: 15/701,749

(22) Filed: Sep. 12, 2017

(65) Prior Publication Data

US 2018/0091291 A1    Mar. 29, 2018

Related U.S. Application Data

(60) Provisional application No. 62/398,697, filed on Sep. 23, 2016.

(51) Int. Cl.
| | |
|---|---|
| *H03L 7/08* | (2006.01) |
| *H04J 3/06* | (2006.01) |
| *H03L 7/099* | (2006.01) |
| *H04L 7/033* | (2006.01) |

(52) U.S. Cl.
CPC .......... *H04L 7/0331* (2013.01); *H03L 7/0807* (2013.01); *H04J 3/0664* (2013.01); *H03L 7/099* (2013.01); *H03L 7/0991* (2013.01); *H04J 3/0667* (2013.01)

(58) Field of Classification Search
CPC ....... H03L 7/099; H03L 7/199; H03L 7/0807; H03L 7/0991; H04L 7/0331; H04J 3/0664; H04J 3/0667
See application file for complete search history.

(56) References Cited

U.S. PATENT DOCUMENTS

| | | | |
|---|---|---|---|
| 2017/0244416 A1* | 8/2017 | Lakshmikumar | ..... H03L 7/0807 |
| 2018/0091291 A1* | 3/2018 | Haddad | ................ H04L 7/0331 |

* cited by examiner

*Primary Examiner* — Sung S Ahn
(74) *Attorney, Agent, or Firm* — Glass and Associates; Kenneth Glass

(57) ABSTRACT

A clock recovery device recovers a master clock over a packet network from incoming synchronization packets. A frequency locked loop generates a control input to a controlled oscillator, which generates an output clock. The frequency locked loop is responsive to pure offset information obtained from the incoming synchronization packets. A transient phase adjuster extracts information from the incoming synchronization packets taking into account transit delays to effect fast frequency adjustment of the control input and to provide a phase adjustment input to the frequency locked loop. A secondary phase path is selectable in response to de-activation of the transient phase adjuster to provide a phase correction to the control input derived from said pure offset information when the transient phase adjuster is inactive.

19 Claims, 4 Drawing Sheets

CLOCK RECOVERY DEVICE WITH SWITCHABLE TRANSIENT NON-LINEAR PHASE ADJUSTER

CROSS REFERENCE TO RELATED APPLICATION

This application claims the benefit under 35 USC 119(e) of prior U.S. provisional application No. 62/398,697, filed Sep. 23, 2016, the contents of which are herein incorporated by reference

FIELD OF THE INVENTION

This invention relates to the field of precision clock recovery in packet networks, for example, in networks implementing the Precision Time Protocol (PTP) described by IEEE Standard for a Precision Clock Synchronization Protocol for Networked Measurement and Control Systems, IEEE Std. 1588™-2008, 24 Jul. 2008, the contents of which are herein incorporated by reference. The invention is applicable to Ethernet networks, but may also be applied to other networks, such as IP networks.

BACKGROUND OF THE INVENTION

PTP is used to synchronize a master clock with slave clocks where extreme precision is required, such as in advanced control or cellular communications systems. Where there are a number of potential master clocks, a best master clock algorithm may select the best clock to use as the master based on predetermined requirements. The selected clock is known as the grand master.

As described in the IEEE standard referenced above, PTP makes use of timestamped synchronization packets to carry timing information over the network to the receiver, where a physical clock signal is recovered using a phase locked loop driving a digitally controlled oscillator. An exemplary prior art PTP clock recovery system is described in U.S. Pat. No. 7,689,854, the contents of which are herein incorporated by reference. Further details are provided in the Hirschmann White paper entitled Precision Clock Synchronization—IEEE 1588, Rev. 1.2, the contents of which are herein incorporated by reference.

Clock recovery often takes place at the boundary between networks. The requirements for boundary clocks are described by ITU recommendation G.8273.2, the contents of which are herein incorporated by reference. Prior art clock recovery devices may not be able to meet the extremely strict requirements with regard to the ability to reduce residual phase error when used as boundary clocks.

Prior art clock recovery devices are based on using the same input phase sample for both frequency and phase paths of the closed loop PLL. In addition, the steady state phase and frequency locked loop incorporated in such devices assumes that the fast phase locking mechanism of the non-linear phase adjustment block corrects the phase every nano-second of the first phase offset seen by the system. This has proved problematic especially during mode and reference switching where this approach causes a permanent residual phase error that the clock recovery device is unable to correct.

SUMMARY OF THE INVENTION

Embodiments of the invention solve the issue of fast phase alignment with zero steady state frequency and phase error, especially for G.8273.2 boundary/slave clocks, while maintaining the heavily constrained wander transfer function characteristics of less than 0.1 dB closed loop gain peaking.

According to the present invention there is provided a clock recovery device for recovering a master clock over a packet network from incoming synchronization packets, comprising a controlled oscillator for generating an output clock; a frequency locked loop for generating a control input for said controlled oscillator, said frequency locked loop being responsive to pure offset information obtained from said incoming synchronization packets; a transient phase adjuster for extracting information from said incoming synchronization packets taking into account transit delays to effect fast frequency adjustment of said control input and to provide a phase adjustment input to said frequency locked loop, said transient phase adjuster being responsive to activate and de-activate commands; and a secondary phase path selectable in response to de-activation of said transient phase adjuster to provide a phase correction to said control input derived from said pure offset information.

The phase/frequency locked loop (PLL) in the clock recovery device is modified such that it receives a secondary phase offset from the master phase samples after initial phase locking has taken place. In general, the clock recovery device is divided into two sub-systems: a transient non-linear phase-adjust system for initial fast phase alignment and a phase and frequency locked loop that functions from time zero. There are thus two independent phase paths employed in a switched approach. One path is for the frequency locked loop, which will see the original pure offset from master. The pure offset does not take into account transit delays minus the initial phase seen by the system. The second path is switched on once the transient phase-adjuster has established the true offset, which takes into account transit delays, from the master phase information. This arrangement has proved very powerful in normal operation and during mode and reference switching because it offered zero phase error while maintaining less than 0.1 dB gain peaking performance, even during mode and reference switching.

According to another aspect the invention provides a method of recovering a master clock over a packet network from incoming synchronization packets, comprising reading pure offset information from the incoming synchronization packets; applying said pure offset information to a frequency locked loop to frequency lock said frequency locked loop to said master clock, said frequency locked loop outputting a control input for a controlled oscillator; and switching between a first mode of operation wherein a transient phase adjuster is active to extract information from said incoming synchronization packets taking into account transit delays and effect fast frequency adjustment of said control input and to provide a phase adjustment input to said frequency locked loop, and a second mode of operation wherein a secondary phase path is active to provide a phase correction to said control input derived from said pure offset information.

BRIEF DESCRIPTION OF THE DRAWINGS

This invention will now be described in more detail, by way of example only, with reference to the accompanying drawings, in which:—

DETAILED DESCRIPTION OF PREFERRED EMBODIMENTS

Figure 1:
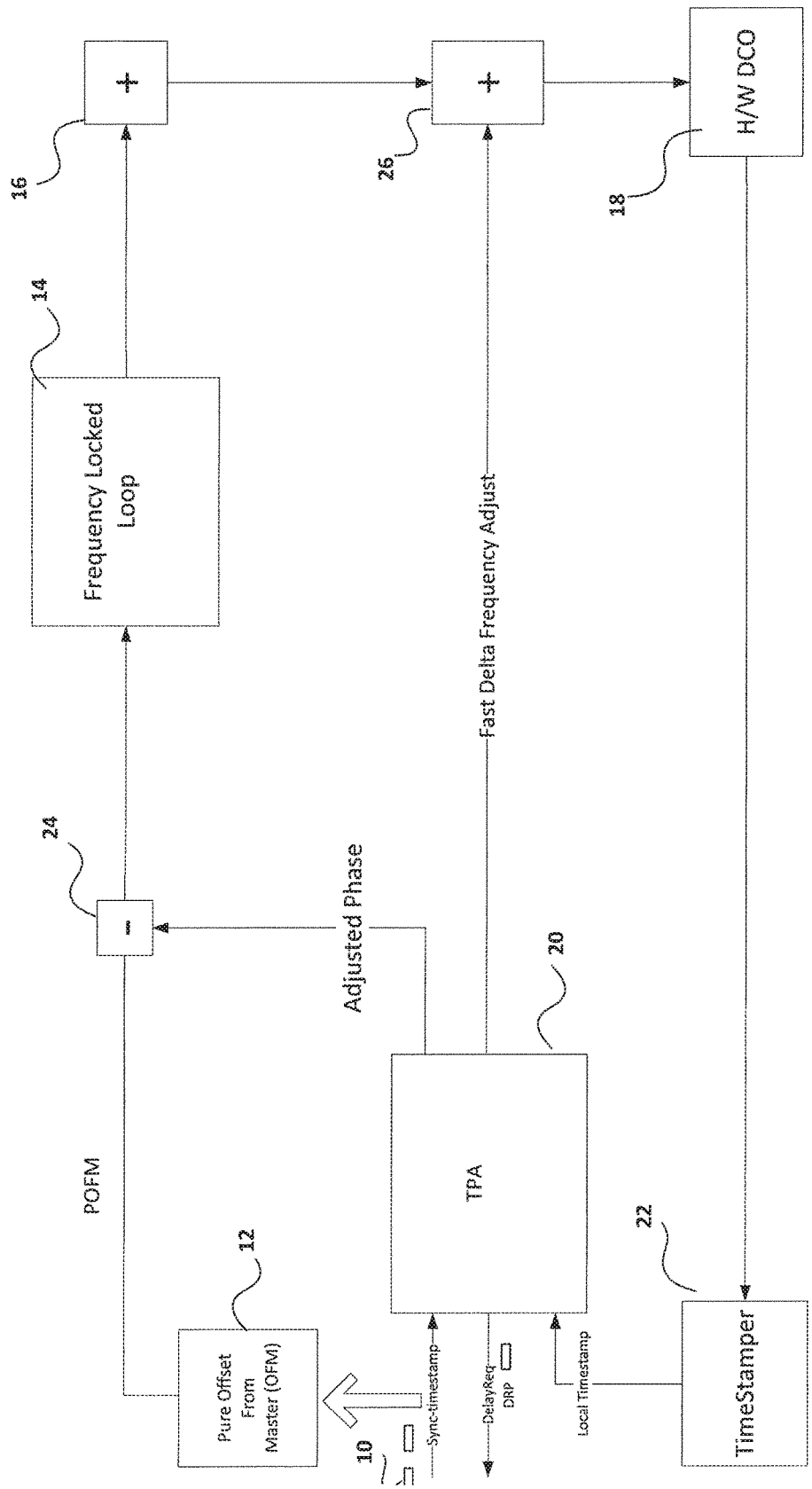
FIG. 1 is a functional block diagram of a prior art clock recovery device.

The prior art clock recovery device shown in FIG. 1 receives synchronization packets 10, for example, IEEE 1558 packets, from a master clock (not shown) over an asynchronous packet network. The synchronization packets are timestamped with a transmission timestamp at the time they enter the network based on the master clock and with a reception timestamp when they arrive at the slave device based on the clock recovered by the clock recovery device at the slave device.

The offset from master (OFM) block 12 extracts the pure offset-from-master (POFM) information from the transmission and reception timestamps of the synchronization packets to determine the phase offset from the master clock, which is used as a control input to the frequency locked loop (FLL) 14 as, for example, described in U.S. Pat. No. 8,483,244, the contents of which are herein incorporated by reference. The pure offset-from-master phase output inherently incorporates the unknown transit delays, which vary from packet to packet. As a result, the FLL 14 locks to the frequency of the master clock based on the incoming synchronization packets 10. Phase is taken care of by transient phase adjuster (TPA) 20 through subtractor 24 as will be described below.

The FLL 14 outputs a frequency control word (FCW) to adder 16 for controlling the hardware digitally or numerically controlled oscillator 18, which outputs a physical clock signal clk that is locked to the frequency of the master clock, but with a potential phase offset resulting from the transit delays in the network. This phase offset is unknown and may vary from packet to packet.

The actual phase offset taking into account transit delays is determined by the transient phase adjuster (TPA) 20, which in accordance with the IEEE 1588 protocol, returns delay request packets (DRP) to the master clock. The DRP packets are timestamped with a local timestamp generated by the timestamper 22 that is based on the local clock signal clk. The TPA 20 computes the actual phase offset from the returned DRP packets taking into account transit delays based on minimum transit time packet selection. The TPA 20 removes the phase offset due to transit time from the POFM output from OFM block 12 in subtractor 24. The FLL 14 thus assumes zero phase offset from the master clock.

The TPA 20 also makes fast adjustments to the frequency of the H/W DCO 18 by periodically modifying the output of the adder 16, which is the frequency control word for the D/W DCO 18, with a fast delta frequency adjust (FDFA) word applied to the second input of adder 26. The FDFA word modifies the frequency control word output by the adder 16 to update the frequency of the H/W DCO 18. The frequency of the FDFA word is based on the frequency extracted from minimum transit time packets selected by the TPA 20. The TPA 20 thus ensures fast phase lock by periodically adjusting the frequency within a set phase slope and frequency change limits. The phase correction determined by TPA 20 is periodically removed from the OFM samples as an input to frequency locked loop 14. The period is programmable, but defaults to 5 seconds.

In the prior art as shown in FIG. 1, the TPA 20 operates continually during operation of the clock recovery device, but as noted above this has proved problematic especially during mode and reference switching scenarios, where a permanent residual phase error occurs that the clock recovery device is unable to correct.

Figure 2:
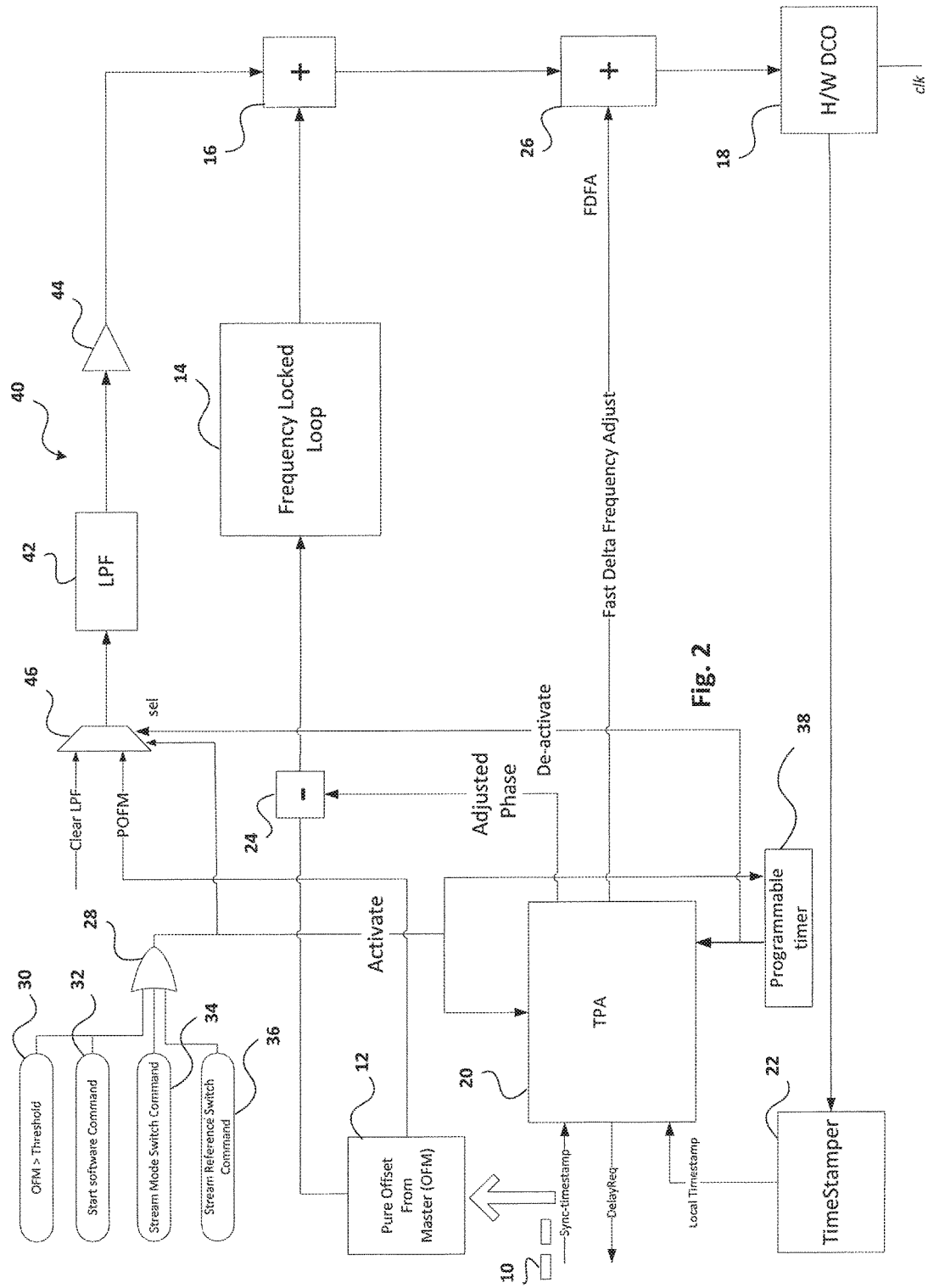
FIG. 2 is a functional block diagram of a clock recovery device in accordance with an embodiment of the invention.

A clock recovery device in accordance with an embodiment of the invention is shown in FIG. 2. Instead of being permanently active, the TPA 20, in this non-limiting example, is controlled by an activate command received from an OR gate 28 and a de-activate command received from a timer 38. The OR gate 28 has as its inputs an OFM threshold detector 30, a start software command 32, a stream mode switch command 34, and a stream reference switch command 36. Stream mode switching occurs when the mode of operation is changed, for example, from Hybrid (with synchronous Ethernet (SyncE)) to pure PTP. In such a case the stream mode switch command 34 input is asserted. Reference mode switching occurs when the master reference clock is changed and as a result the stream reference switch command 36 is asserted. When any one of these inputs is asserted, the TPA 20 is activated responsive to an asserted activate command, the programmable timer 38 started, and the multiplexer 46 selects the Clear LPF input. The timer 38 then issues a de-activate command after a programmable amount of time has elapsed in order to de-activate the TPA 20.

In accordance with embodiments of the invention the clock recovery device includes a secondary steady-state phase adjust path 40 comprising a low pass filter 42 and gain controller 44, which applies a second input to the adder 16.

When the TPA 20 is active, the low pass filter 42 in path 40 is cleared by the clear LPF signal applied to its input. The clear LPF signal is a predetermined low signal, which may be a zero input, selected by multiplexer 46 in response to an output from OR gate 28. In this condition the clock recovery device operates in a manner similar to the prior art illustrated in FIG. 1 because the secondary path 40 is inactive.

When the TPA 20 is de-activated with a de-activate command from the programmable timer 38 after the programmable time has elapsed, the multiplexer 46 is controlled through its sel input to select the pure OFM input from the OFM block 12, which is passed through the low pass filter 42 and the gain controller 44. The gain controller 44 controls the speed of the secondary phase lock and the gain peaking. The secondary phase adjust path 40 mimics second order phase locked loop performance by adjusting the output of the FLL 14 in adder 16, thus providing zero steady state phase error.

The time of the programmable timer 38 is selected such that at the time the TPA 20 is de-activated the output clk will be synchronized in phase and frequency with the master clock. Any subsequent phase variations between the master and output clock signal clk will be taken care of by the secondary phase path 40. If that phase variation exceeds the threshold set in threshold block 30, the TPA 20 will be re-activated for the time period set by the programmable timer 38 to rapidly bring down the phase to an acceptable level.

It will be understood that, with the exception of the H/W DCO 18 the device may be implemented in software.

The operation of the clock recovery device is thus as follows:

Upon any of the following events: Startup (Hard reset), mode switching on the same packet stream, reference switching between two packet streams, phase jumps due to oscillator or grand master drifts, the TPA 20 is activated by an asserted activate command from OR gate 28. The phase of the FLL 14 is updated through subtractor 24 and the FDFA input is applied to the adder 26. Zero input is applied to the secondary phase path 40, which is inactive.

The FLL 14 operates continuously from startup or any of the other significant events noted above with the corrected input phase supplied by the TPA 20 through subtractor 24 until the programmable time determined by the timer 38 has lapsed. At that point FDFA word is no longer applied to adder 26, and the adjusted phase is no longer applied to subtractor 24. The pure offset POFM from master block 12 is applied to the input of the low pass filter 42. The gain controller 44 applies a correction input to the adder 16, which corrects for slow drift relative to the master clock.

Embodiments of the invention thus provide a switched second-order phase locked loop (PLL) with zero steady state phase error using two distinct input phase to phase and frequency paths. The clock recovery device provides an integrated solution for continuous fixed bandwidth frequency locking capability with a switched fast phase locking performance.

The use of pure offset from master phase information brings down steady-state phase error to zero with less than 0.1 dB closed loop gain peaking. The transient non-linear phase adjust mechanism is triggered upon system reset, mode or reference switching. The steady state small phase adjust path 40 mimics second order PLL performance, thus providing zero steady state phase error.

Figure 3:
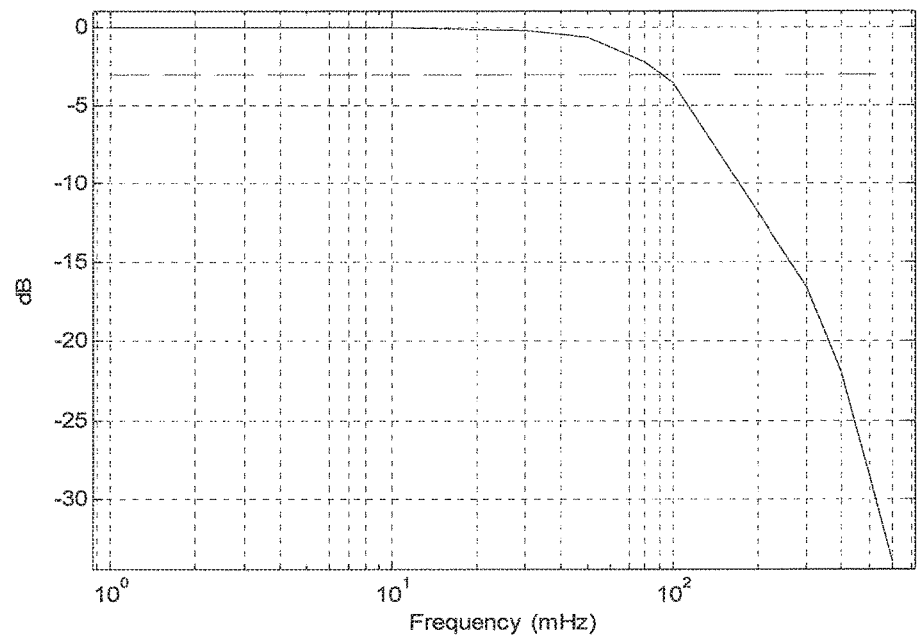
FIG. 3 is plot showing the wander transfer function of the device shown in FIG. 2.

The performance of the clock recovery device in accordance with an embodiment of the invention can be seen in FIGS. 3 to 6, where FIG. 3 is a plot of gain against frequency showing the wander transfer function showing the 100 mHz bandwidth at the −3 dB point.

Figure 4:
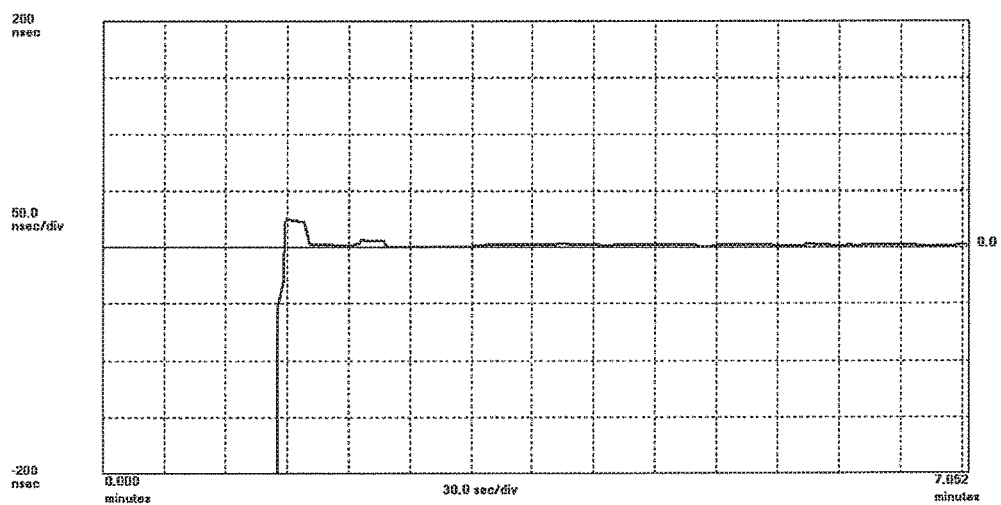
FIG. 4 is a first plot showing the switching performance of the device shown in FIG. 2.
Figure 5:
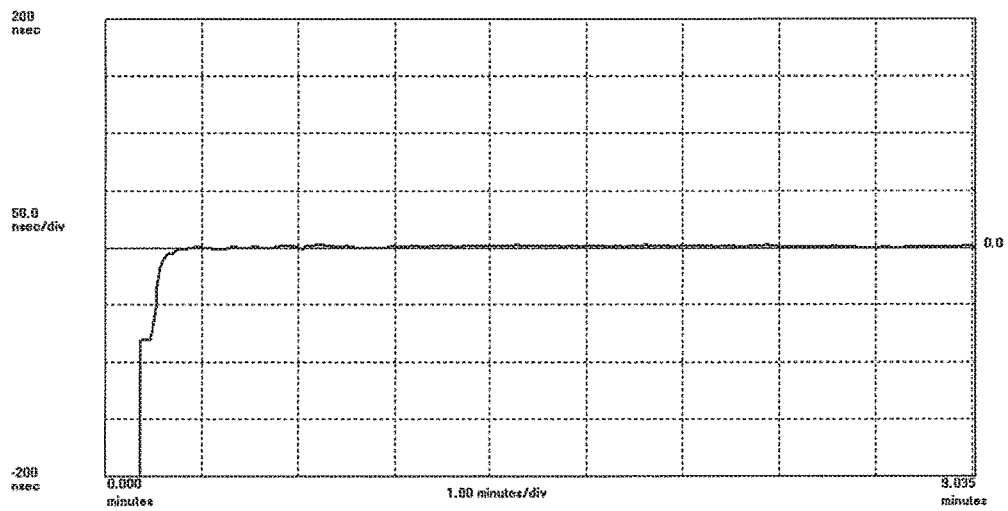
FIG. 5 is a second plot showing the switching performance of the device shown in FIG. 2.
Figure 6:
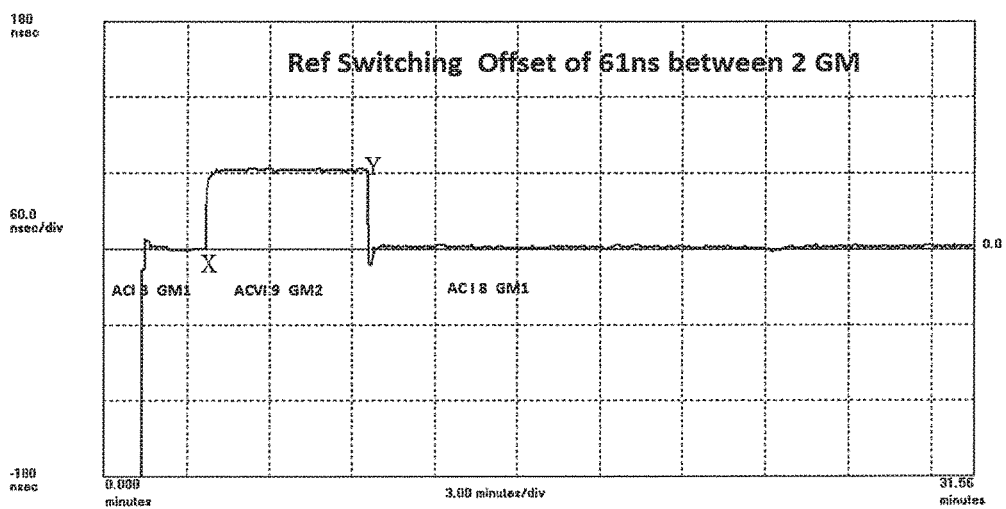
FIG. 6 is a plot showing the reference switching performance of the device shown in FIG. 2.

FIGS. 4, 5, and 6 are plots of real time in minutes (X-axis) and against the time interval error (TIE, where the TIE is the error incurred by the clock in a given time interval) (Y-axis) between master and slave devices in nanoseconds. FIGS. 4 and 5 show that the device illustrated in FIG. 2 rapidly converges to TIE=0 when a switch occurs in switching software operation mode, at the approximately 1½ minute point in FIGS. 4 and 20 second point in FIG. 5.

FIG. 6 shows grandmaster reference switching mode with initial phase offset. It will be seen that at approximate time 1.5 minutes, grandmaster 1 (GM1) is stable and rapidly locked on to. At time X the device switches to grandmaster 2 (GM2), which is offset from GM1 by 61 ns. The switch is clean without significant perturbation. At time Y, the device switches back to GM1, again without significant perturbation.

It should be appreciated by those skilled in the art that any block diagrams herein represent conceptual views of illustrative circuitry embodying the principles of the invention. For example, a processor may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. The functional blocks or modules illustrated herein may in practice be implemented in hardware or software running on a suitable processor.

The invention claimed is:

1. A clock recovery device for recovering a master clock over a packet network from incoming synchronization packets, comprising:
   a controlled oscillator for generating an output clock;
   a frequency locked loop for generating a control input for said controlled oscillator, said frequency locked loop being responsive to pure offset information obtained from said incoming synchronization packets;
   a transient phase adjuster for extracting information from said incoming synchronization packets taking into account transit delays to effect fast frequency adjustment of said control input and to provide a phase adjustment input to said frequency locked loop, said transient phase adjuster being responsive to activate and de-activate commands;
   a secondary phase path selectable in response to de-activation of said transient phase adjuster to provide a phase correction to said control input derived from said pure offset information; and
   a multiplexer responsive to a select input to select a zero input for said secondary phase path when said transient phase adjuster is active and to select said pure offset information as an input to said secondary phase path when said transient phase adjuster is de-activated.

2. A clock recovery device as claimed in claim 1, wherein said secondary phase path comprises a low pass filter and gain controller.

3. A clock recovery device as claimed in claim 1, further comprising a programmable timer for issuing said de-activate command after a programmable amount of time has elapsed.

4. A clock recovery device as claimed in claim 1, further comprising a first adder for combining an output of said secondary phase path with an output of said frequency locked loop and a second adder for combining an output of said transient phase adjuster with an output of said first adder.

5. A clock recovery device as claimed in claim 2, further comprising an offset from master threshold detector for passing said activate commands to the transient phase adjuster if a phase offset between said output clock and the master clock exceeds a predetermined threshold.

6. A clock recovery device as claimed in claim 5, further comprising a start software command module, a stream mode switch command module, and a stream reference switch module for issuing activate commands when a corresponding start mode, a stream mode switching, and a reference mode switching conditions occur, and an OR gate for passing said activate commands to the transient phase adjuster and the select input of said multiplexer.

7. A clock recovery device as claimed in claim 1, wherein said controlled oscillator is a digitally controlled oscillator or a numerically controlled oscillator.

8. A clock recovery device as claimed in claim 7, wherein, when said transient phase adjuster is active, said transient phase adjuster modifies the output of said frequency locked loop, and when said transient phase adjuster is inactive, said secondary phase path modifies the output of said frequency locked loop.

9. A clock recovery device as claimed in claim 8, wherein said digitally controller or numerically controlled oscillator is responsive to a frequency control word, and further comprising a first adder for adding the output of said secondary phase path to the output of said frequency locked loop, and a second adder for adding the output of said transient phase adjuster to the output of said frequency locked loop.

10. A method of recovering a master clock over a packet network comprising:
receiving incoming synchronization packets at an input of a clock recovery device that includes a transient phase adjuster and a secondary phase path;
reading, at said clock recovery device, pure offset information from the incoming synchronization packets;
applying, at said clock recovery device, said pure offset information to a frequency locked loop to frequency lock said frequency locked loop to said master clock, said frequency locked loop outputting a control input for a controlled oscillator of said clock recovery device;
generating a clock signal at an output of said controlled oscillator; and
switching between a first mode of operation wherein a zero input is provided to said secondary phase path and wherein said transient phase adjuster is active to extract information from said incoming synchronization packets taking into account transit delays and effect fast frequency adjustment of said control input and to provide a phase adjustment input to said frequency locked loop, and
a second mode of operation wherein said transient phase adjuster is inactive and said pure offset information is selected as an input to said secondary phase path, such that said secondary phase path provides a phase correction to said control input derived from said pure offset information.

11. A method as claimed in claim 10, wherein said transient phase adjuster is activated on startup and de-activated after a predetermined period of time has elapsed.

12. A method as claimed in claim 11, wherein said predetermined period is programmable.

13. A method as claimed in claim 10, wherein a multiplexer selects said zero input for said secondary phase path when said transient phase adjuster is active and selects said pure offset information as an input to said secondary phase path when said transient phase adjuster is inactive.

14. A method as claimed in claim 10, wherein said pure offset information is passed through a low pass filter and gain controller in said secondary phase path.

15. A method as claimed in claim 10, wherein an output of said secondary phase path is combined with an output of said frequency locked loop at a first adder and an output of said transient phase adjuster is combined with an output of said first adder.

16. A method as claimed in claim 10, wherein said transient phase adjuster is activated in response to a command from an offset-from-master threshold detector if a phase offset between said output clock and the master clock exceeds a predetermined threshold.

17. A method of recovering a master clock over a packet network comprising:
receiving incoming synchronization packets at an input of a clock recovery device that includes a transient phase adjuster and a secondary phase path;
reading, at said clock recovery device, pure offset information from the incoming synchronization packets;
applying said pure offset information to a frequency locked loop of said clock recovery device to frequency lock said frequency locked loop to said master clock, said frequency locked loop outputting a control input for a controlled oscillator of said clock recovery device;
generating a clock signal at an output of said controlled oscillator;
issuing an activate command from a software command module when a corresponding start mode condition occurs, from a stream mode switch command module when a stream mode switching condition occurs or from a stream reference switch module when a reference mode switching condition occurs;
when said activate command is issued, initiating a first mode of operation wherein said transient phase adjuster is active to extract information from said incoming synchronization packets taking into account transit delays and effect fast frequency adjustment of said control input and to provide a phase adjustment input to said frequency locked loop, and
after a programmable amount of time has elapsed, initiating a second mode of operation wherein said transient phase adjuster is inactive and said pure offset information is selected as an input to said secondary phase path, said secondary phase path providing a phase correction derived from said pure offset information to said control input.

18. A method as claimed in claim 10, wherein said controlled oscillator is a digitally controlled oscillator or a numerically controlled oscillator.

19. A clock recovery device for recovering a master clock over a packet network from incoming synchronization packets, comprising:
a controlled oscillator for generating an output clock;
a frequency locked loop for generating a control input for said controlled oscillator, said frequency locked loop being responsive to pure offset information obtained from said incoming synchronization packets;
one or more command module for issuing an activate command when a start mode condition occurs, a stream mode switching condition occurs or a reference mode switching condition occurs;
a programmable timer coupled to said one or more command module, said programmable timer for issuing a de-activate command after a predetermined amount of time has elapsed from the time that said activate command issued;
a transient phase adjuster coupled to said one or more command module and to said programmable timer, the transient phase adjuster for extracting information from said incoming synchronization packets taking into account transit delays to effect fast frequency adjustment of said control input and to provide a phase adjustment input to said frequency locked loop, said transient phase adjuster being responsive to said activate command and said de-activate command;
a low pass filter;
a multiplexer coupled to said one or more command module, said multiplexer including a first input for receiving a low signal or zero input, including a second input for receiving said pure offset information, and including an output coupled to said low pass filter, said multiplexer operable upon said issuing said activate command to provide said low signal or zero input to said low pass filter, and operable upon said issuing said de-activate command to provide said pure offset information as an input to said low pass filter; and a gain controller having an input coupled to an output of said low pass filter and having an output coupled to said controlled oscillator, said gain controller operable when said pure offset information is input to said low pass filter to provide a phase correction derived from said pure offset information to said controlled oscillator.

\* \* \* \* \*